(12) United States Patent
Pinter et al.

(10) Patent No.: US 6,772,364 B1
(45) Date of Patent: Aug. 3, 2004

(54) FAULT TOLERANT FIELD UPDATING WITH ALTERNATION OF MEMORY AREAS

(75) Inventors: Robert Pinter, St. James, NY (US); William T. Austin, West Babylon, NY (US)

(73) Assignee: Nortel Networks Limited, St. Laurent (CA)

( * ) Notice: Subject to any disclaimer, the term of this patent is extended or adjusted under 35 U.S.C. 154(b) by 390 days.

(21) Appl. No.: 09/750,724

(22) Filed: Dec. 28, 2000

(51) Int. Cl.[7] .................................................. H02H 3/05
(52) U.S. Cl. ............................................... 714/5; 714/8
(58) Field of Search ............................. 714/5, 6, 8, 42; 711/102, 103, 104

(56) References Cited

U.S. PATENT DOCUMENTS

| | | | | |
|---|---|---|---|---|
| 5,440,632 A | * | 8/1995 | Bacon et al. ............... | 380/242 |
| 6,272,607 B1 | * | 8/2001 | Baentsch et al. ........... | 711/162 |
| 6,343,379 B1 | * | 1/2002 | Ozawa et al. ............... | 725/63 |
| 6,510,083 B1 | * | 1/2003 | See et al. ............... | 365/185.24 |
| 6,581,157 B1 | * | 6/2003 | Chiles et al. ................ | 713/1 |

* cited by examiner

*Primary Examiner*—Dieu-Minh Le
(74) *Attorney, Agent, or Firm*—Kenneth P. Robinson

(57) ABSTRACT

Flash ROM memory may be utilized to enable field updates of system-level code necessary for providing system operation. However, a disruption during downloading can render a system inoperable. With alternating use of two memory areas, downloading is provided on a fault tolerant basis. A previously-stored functional code version is held in a first memory area. A second memory area is erased and an update code version is downloaded and stored therein. In case of unsuccessful downloading, the previously-stored functional code version remains usable. For the next downloading a later update version is loaded into the first memory area, while the previously downloaded update code version is held in the second memory area for use if needed. By this alternation of memory areas, one memory area can safely be erased or over-written for new code downloading, while an operationally validated prior version of the code remains available in case of downloading failure.

26 Claims, 5 Drawing Sheets

FAULT TOLERANT FIELD UPDATING WITH ALTERNATION OF MEMORY AREAS

FIELD OF THE INVENTION

The invention relates to updating of computer code and, more particularly, to methods and apparatus to enable fault tolerant field updating of such code in non-volatile memory, such as flash ROM (read-only memory).

BACKGROUND OF THE INVENTION

In many computer-based applications it is desirable to be able to change or update code in a system already placed in service, as in a system at a field location. Such code updates may be provided by downloading via Internet or other communication media. One potential problem is that the update process may be disrupted before completion, as by a power fluctuation, communication link disruption, etc.

However, it is also desirable to be able to update or load code while a system is operational to minimize system disruption.

Non-volatile memory, such as flash ROM memory, may be used for code storage. Such memory provides the capability of updating stored code (remotely or locally) while the system is in field service. However, a problem with such updating is that the flash memory must be erased before it can be reprogrammed. If system-level code (i.e., code providing system operation) is to be updated and a disruption occurs after erasure and prior to load installation, the system may be rendered inoperable. In such case, the fall-back solution has been to return the system to functionality by shipping it or discrete components to the factory or maintenance depot to have the flash memory reloaded. Alternatively, the problem may be solved by servicing of the system in the field, with substitution of memory components having the program load.

It is thus desirable to provide a fault tolerant approach in order to obtain the benefits of field updates of code stored in memory, such as flash ROM, while minimizing the disadvantages of potential system inoperability.

SUMMARY OF THE INVENTION

To enable field updates of memory, memory alternation is implemented by use of at least two memory areas. Code is initially stored in a first memory area and a first update version of the code is stored in the second memory area. Then, a second update version is downloaded into the first memory area, retaining the first update version for use if the downloading is not successful. As a further aspect, update methods are provided to enable choice of the memory area to be erased for download purposes, without disturbing a more recent operative version of the code available in a remotely located system. Start-up routines are provided to enable start-up on the basis of using the newer, or most recent, update version upon successful download.

For a better understanding of the invention, together with other and further objects, reference is made to the accompanying drawings and the scope of the invention will be pointed out in the accompanying claims.

DETAILED DESCRIPTION

Figure 1:
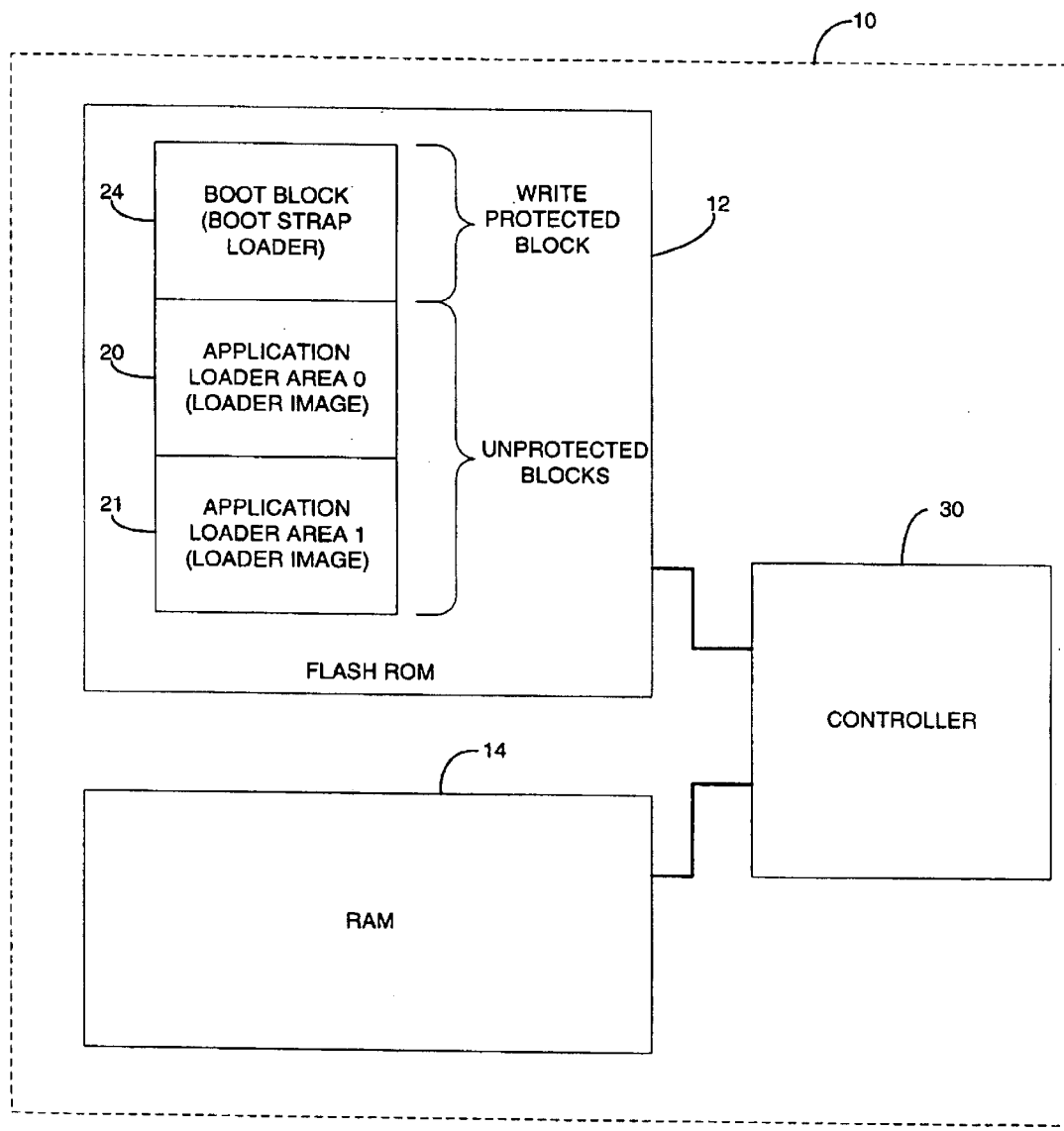
FIG. 1 shows a memory update control system employing alternation of memory areas for fault tolerant updating.

FIG. 1 shows a memory update control system 10 which employs alternation of memory areas. The system has a non-volatile memory 12, which may be flash ROM (read-only memory) and a volatile memory 14, which may be RAM (random-access memory).

Memory 12, as illustrated, includes a first memory area 20 (shown as application loader area 0 in FIG. 1) and a second memory area 21 (shown as application loader area 1), each of which is suitable to store code of a computer program. The memory areas may be distinct memory circuitry, proportioned memory co-existing on a single integrated circuit, or distributed across a memory chip set. As will be further described, first and second memory areas 20 and 21 are independently accessible so as to permit downloading into either area without affecting a computer program stored in the other area.

For purposes of example, such computer program may take the form of code for an application loader program (which may herein be referred to as "loader image code") which provides system functionality. The loader image code is thus utilized in performing the critical function of application start-up in activating a computer system which was previously shut down. In a typical computer system, the absence of a functional copy of such loader image code renders the computer system inoperable. Memory 12 also includes a write-protected memory area 24 suitable to store boot block code usable to load and validate loader image code. Mechanical or other suitable form of protection may be provided as appropriate to protect code stored in memory area 24 from being over-written or otherwise lost.

As will be further described, with memory 12 provided in the form of flash ROM, an initial version of loader image code may be factory-loaded into first memory area 20 in a telephony or other computer-based system. Then, after such system is placed in operation in the field, assume that a first update version of the same loader image code has subsequently been downloaded into second memory area 21 (e.g., from a central location). Such downloading is carried out without disturbing the initial version stored in first memory area 20.

Memory update control system 10 also has a controller 30 to control updating of the stored computer program (e.g., updating of the loader image code) by loading (e.g., downloading) of new computer program versions. A suitable executable program or programs can be provided for this purpose. As shown, controller 30 includes memory interface connections to memory units 12 and 14. Controller 30 may include a suitable microprocessor processor capability and may also be utilized to provide or control other or general operational aspects of a computer system which incorporates control system 10.

With respect to memory update control, controller 30 is arranged to do the following in order to permit downloading of a second update version of the loader image code. This assumes that the initial and first update versions are already stored in memory areas 20 and 21 (i.e., loader areas 0 and 1 in FIG. 1).

Controller 30 identifies the one of the first and second memory areas 20 and 21 currently storing the newest functionally validated version of the loader image code. In the present example, initial and first update versions of such code were previously stored, prior to deployment of the system in the field. Assuming both versions were previously functionally validated, the second memory area 21 will be identified as storing the newer validated version of the loader image code (e.g., the first update version).

Controller 30 then enables storage (e.g., via downloading) of a subsequent update version of the loader image code in the one of the first and second memory areas that was not identified as currently storing the newest validated version. Thus, in this example, downloading of the subsequent update version into the first memory area will be enabled (e.g., by first erasing the initial code version from area 20).

It will be appreciated that, if only one functionally validated version of the loader image code was identified as present (in either the first or second memory area) controller 30 would enable downloading into the memory area not containing the identified functionally validated version. The word "erase" is used in its dictionary sense of "remove or destroy", to include erasure, over-writing and other techniques suitable to enable download into memory.

Memory update control system 10 is effective to enable downloading of a subsequent update version of the loader image code into flash ROM, while providing fault tolerant protection against loss of system operability resulting from a download disruption. In the event of a download disruption, the previously stored and functionally validated version of the loader image code (the first update version, in the first example above) would remain available in the memory area not disturbed by the download (the second memory area 21, in the example). That is, the computer system would remain operable in spite of the download disruption and a further attempt to download the update version could then be carried out.

At a time after the successful download and functional verification of the second update version as described, it may become desirable to further update the loader image code. Further subsequent updates may be termed the third update version, the fourth update version, etc. The system 10 can be employed over a period of time in carrying out the downloading of a series of updates, without limitation on the total number of such updates. This capability results from alternation of memory areas. Thus, in FIG. 1 memory 12 includes first and second memory areas 20 and 21. In the above example, the initial version of the loader image code is stored in first memory area 20 and the first update version is stored in second memory area 21.

Extending the downloading process as described above, when a download of the second update version is to take place, this version is stored in first memory area 20. When it then becomes desirable to download a subsequent version (i.e., the third update version) of the loader image code, it will be stored in second memory area 21 (after erasing the first update version previously stored therein).

Thus, once it is ascertained that the second update version has been verified functional (as will be further described) and is operational, the previous version of the loader image code stored in first memory area 21 is no longer needed. Accordingly, the third update version can be downloaded into second memory area 21 in place of the "no longer needed" first version. Then, once it is validated and operational the third update version becomes the loader image code used in system operation.

Later, if it becomes appropriate to implement the fourth update version of the loader image code it can be downloaded into first memory area 20, in substitution for the second update version which had been stored there. It will thus be seen that by employing alternation of memory areas as disclosed herein, the provision of two alternate memory areas facilitates repeated downloading of code updates. Each download is accomplished in a protected fault tolerant manner with a copy of the last operationally functional version of the code held in reserve for use in case of an unsuccessful download.

Figure 2:
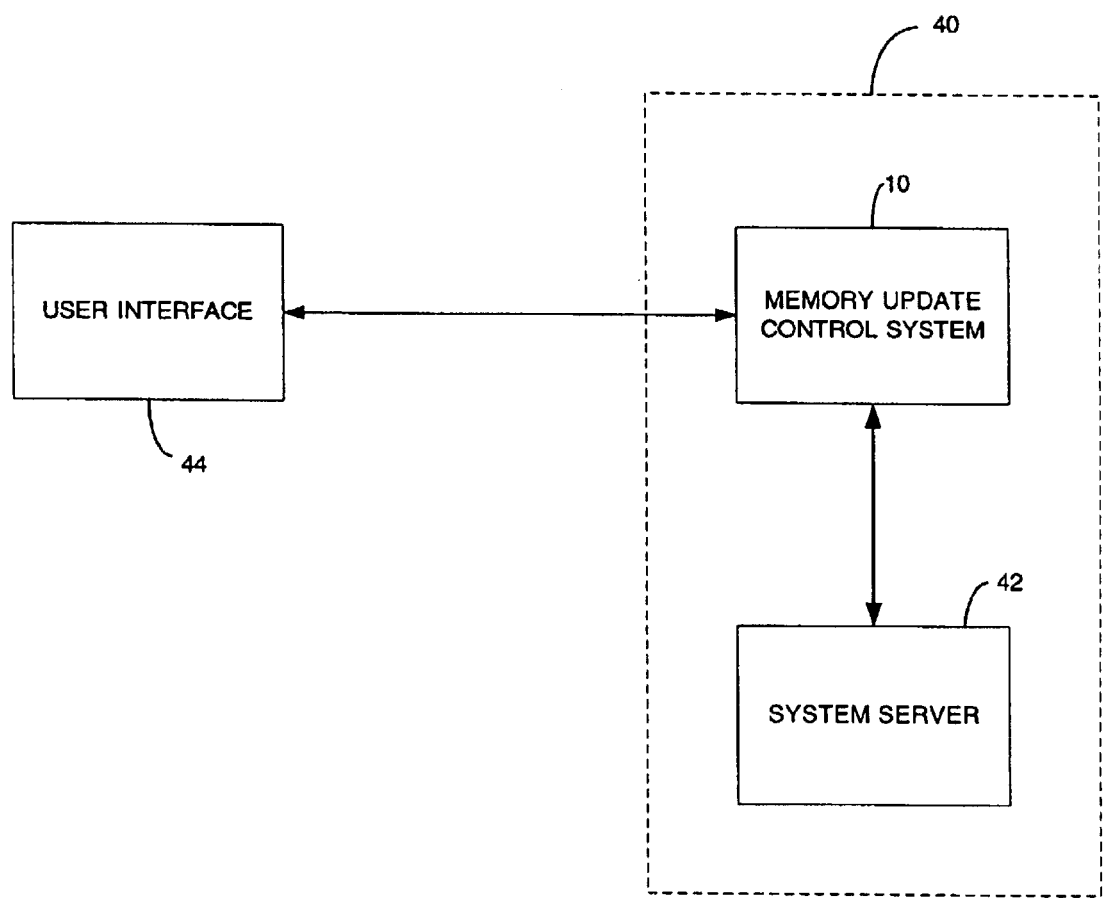
FIG. 2 is a simplified system overview.

Preparatory to considering specific steps of a memory update method, reference is made to the simplified system overview diagram of FIG. 2. As shown, a computer-based operating system 40, which may be a telephony or other type of system, includes a memory update control system 10 (e.g., system 10 of FIG. 1) and a system server 42. System server 42 is arranged to store computer programs, such as application programs to be loaded for system operation by running of the loader image code referred to above. A communications interface provides data access between control system 10 and server 42. As represented in FIG. 2, a user interface unit 44 may be provided at a different location than system 40 (e.g., system 40 at field installation and interface unit 44 at the factory or a maintenance depot). User interface unit 44 may be provided as a computer workstation running suitable programs and may be arranged to enable communication with system 40 via a communications interface, such as the Internet, dial-up line, or other utility. User interface unit 44 may thus be used to download update versions of the loader image code as described above.

Figure 3:
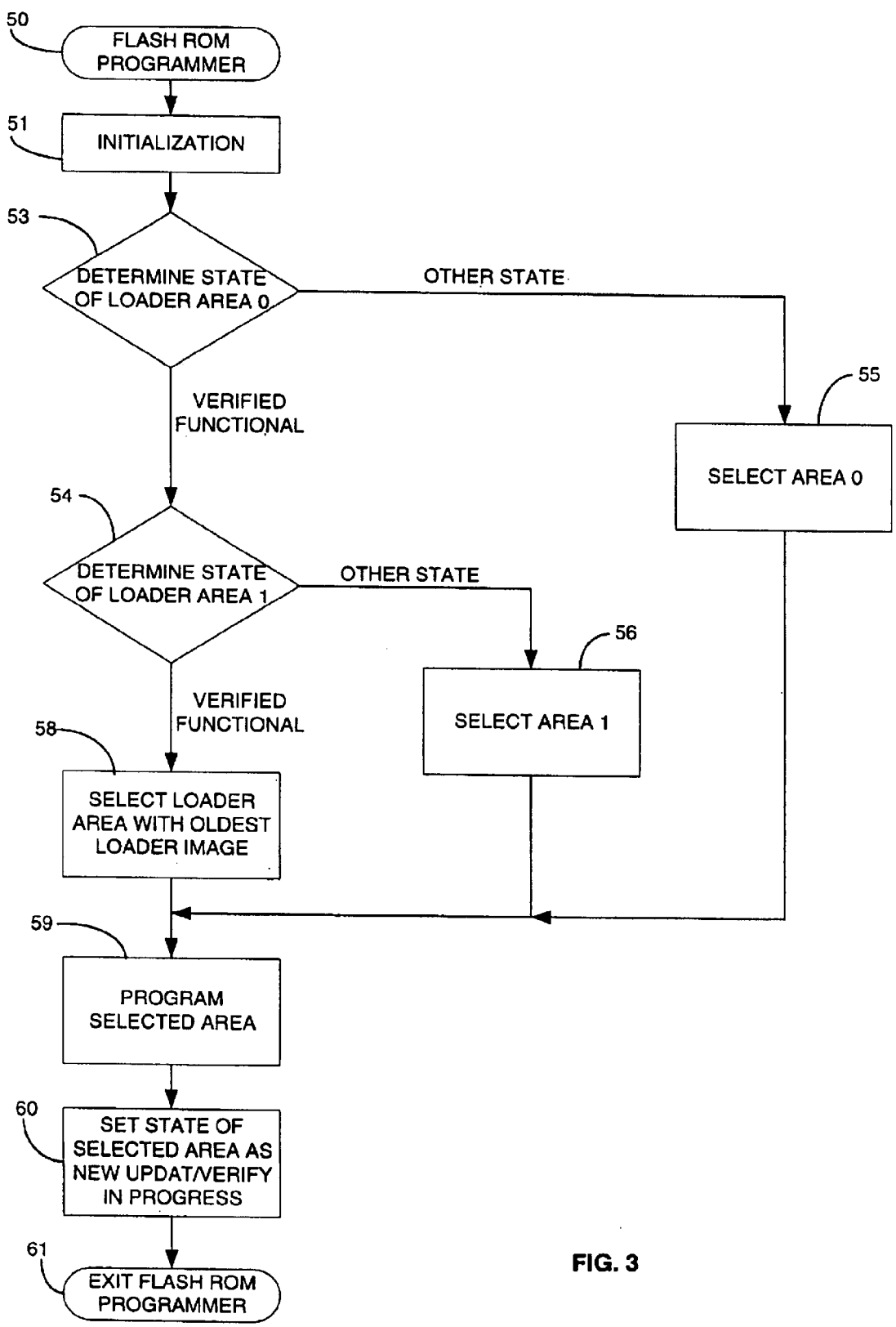
FIG. 3 is a flow chart useful in describing downloading of code in the context of a memory update method employing alternation of memory regions.

FIG. 3 is a flow chart useful in describing downloading of code in the context of an example of a memory update method employing alternation of memory areas, such as first and second memory areas 20 and 21 of FIG. 1.

At 50 in FIG. 3, a flash ROM programmer routine is activated (e.g., via user interface unit 44 of FIG. 2) to provide system initialization at 51. The routine proceeds to determine the current state of loader area 0 at 53 and of loader area 1 at 54. As illustrated, such state may either be "verified functional" or "other".

The latter, as represented by branching to the right in FIG. 3, may more particularly include characterization as states of: empty, integrity fail, verify fail or new update/verify in progress. As shown, the result of loader area 0 being not "verified functional" is a determination at 5:5 to select loader area 0. Similarly, if loader area 1 is not characterized as "verified functional", the result is a determination at 56 to select loader area 1. These actions are appropriate, because at least one loader area should previously have been characterized as "verified functional" and if the other loader area has not, it is the area which should be selected for erasure/overwriting.

If both loader areas 0 and 1 (representing first and second memory areas 20 and 21 of FIG. 1) are "verified functional", then the loader area identified as storing the oldest loader image code is selected at 58. The desired new or revised version of the loader image code is then downloaded at 59 for storage in the loader area selected as the operative one of selection actions 55, 56 or 58. Following downloading, at 60, the indicated state of the selected loader area is changed to "new update/verify in progress". This is done for reference purposes with respect to system start-up as will be addressed in FIG. 4. The completed ROM programmer routine is exited at 61.

It will be seen that each time the ROM programmer routine of FIG. 3 is run for download of a loader image code, the new update version of the loader image code will be downloaded and stored in the one of the first and second memory areas 20 and 21 of FIG. 1 which was not identified as storing the newer operationally validated version. That is to say, as between previously stored versions, the newer verified functional version of the loader image code (as available in memory areas 20 and 21) will be retained and remain available for use. The term "oldest version" may thus be used as an umbrella term to refer to the memory area which actually contains an older operational version of the loader image code, contains no version at all, contains a version which failed an integrity check, or otherwise does not contain the newest operationally validated version. With memory alternation as described, the oldest version is erased/overwritten, while a subsequent, i.e., the newest operationally validated or verified functional version, is retained.

Figure 4:
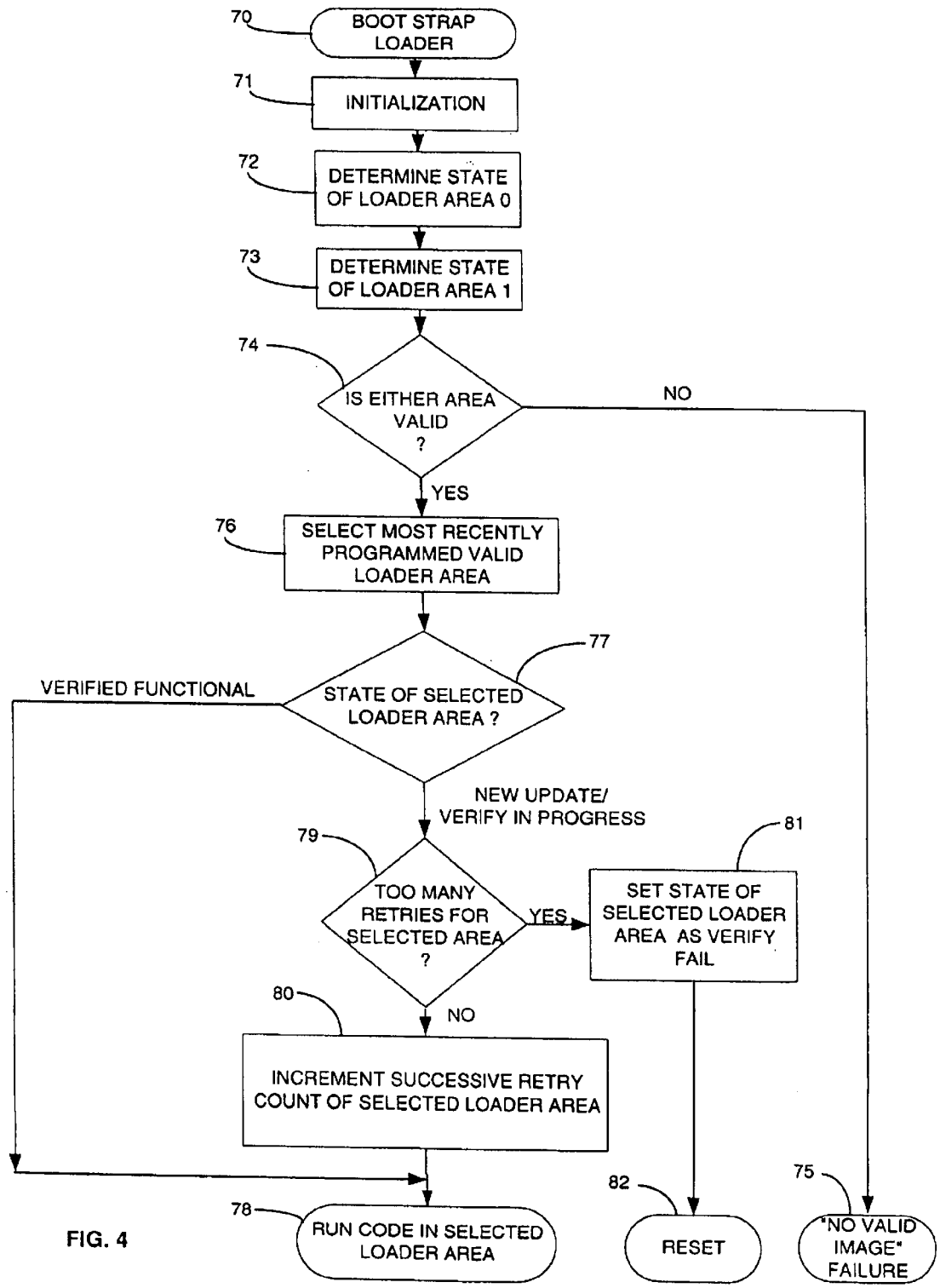
FIG. 4 is a flow chart useful in describing a start-up routine in the context of a memory update method employing alternation of memory regions.

FIG. 4 is a flow chart useful in describing one form of start-up routine which can be run following downloading of an update version of the loader image code to verify successful downloading, and also run thereafter at each system start-up.

At 70, the boot strap loader program permanently stored in the boot block memory area 24 of FIG. 1 is activated to provide system initialization at 71. The present state of each of loader areas 0 and 1 is determined at 72 and 73. In this example, the possible states are: area empty, integrity fail, verify fail, new update/verify in progress, or verified functional. At 74, the "verified functional" and "new update/verify in progress" states are treated as valid states. If neither loader area 0 nor loader area 1 is characterized by a valid state, the system is inoperable as represented by the NO path to failure block 75. If one or both of the loader areas 0 and 1 (representing the first and second memory blocks 20 and 21 of FIG. 1) are characterized by one of the two valid states, the start-up routine proceeds to 76.

At 76, the most recently programmed loader area characterized by a valid state is selected. If only one of the loader areas has a valid state, it is selected.

If both have valid states, the most recently programmed (e.g., storing the most recently downloaded version of the loader image code) is selected. At 77 the specific valid state of the selected loader area is sorted. If the state of the selected loader area is "verified functional", the loader image code stored in that loader area is launched and run at 78, to provide normal system operation. If the state of the selected loader area was found at 77 to be "new update/verify in progress", then at 79 it is determined whether too many retries have already been implemented. Any number of retries may be pre-set as respresenting "too many" retries (for example, a total of 5 prior unsuccessful attempts to launch and run the stored loader image code).

If there have already been too many unsuccessful retries, at 81 the state of the loader area which was selected at 76 is set to "verify fail". At 82, the start-up routine may be reset for a repetition of the above steps 70–76. If on the initial running of this program both loader areas are characterized by valid states, the loader area storing the older version of the loader image code is selected at 76 (since the other loader area has now been characterized at 81 by the "Everify fail" state). This older version may then be launched and run at 78. Of course, if the initial running of the program identified only one loader area characterized by a valid state, then there is no loader area characterized by a valid state at 74 and the program will end with failure at 75, as discussed above.

Returning to 77, if the selected loader area is characterized by the "new update/verify in progress" state, at 79 it may be determined that there have not been too many retries (e.g., less than 5 prior unsuccessful launch attempts). It so, at 80 the successive retry count will be incremented to record an additional retry attempt and at 78 an attempt will be made to launch and run the loader image code. If this attempt is not successful, the boot strap loader program may be re-started at 70 to initiate another attempt.

However, if the retry limit is then applicable, an indication is provided to the system operator of inability to launch and run the loader image code. Alternatively, the attempt at 78 to launch and run the loader image code (which was stored subject to a "new update/verify in progress" state characterization) may be successful. If so, in addition to the successful running of the loader image code, start-up of an application program will be initiated.

Figure 5:
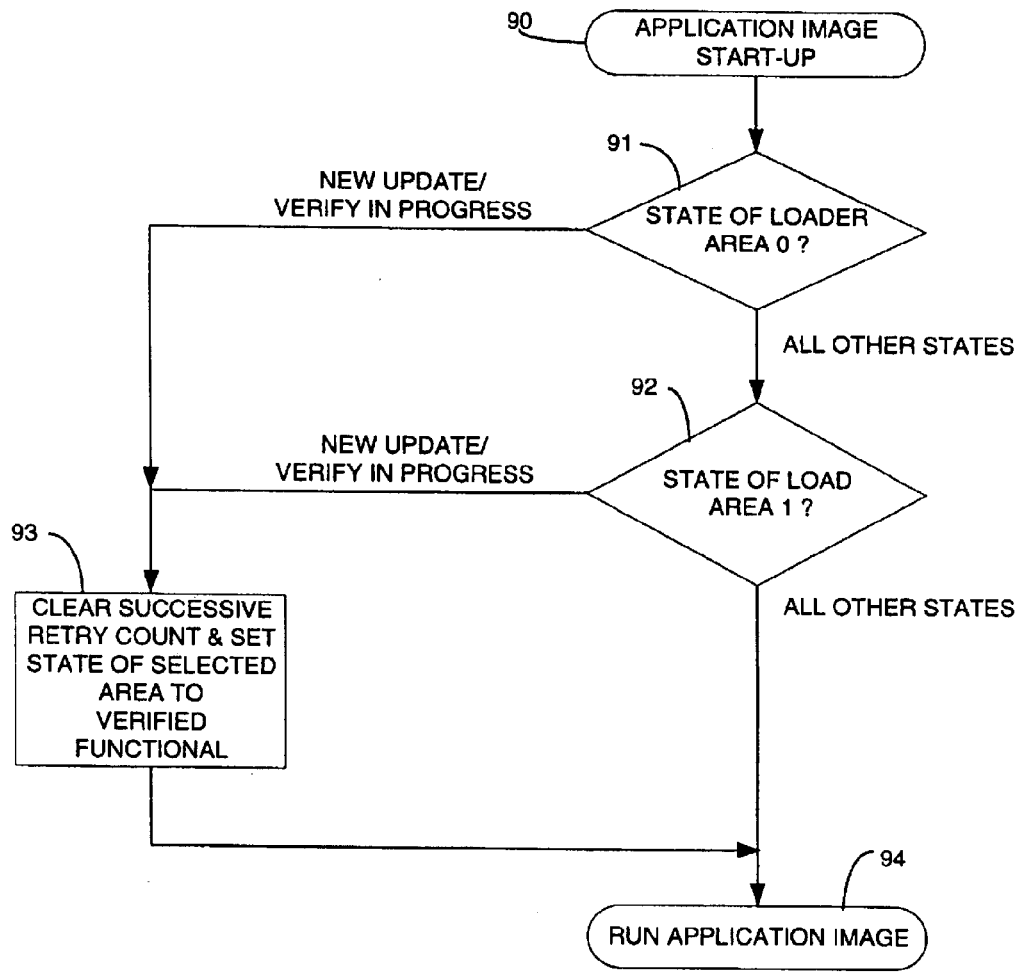
FIG. 5 is a flow chart useful in describing an application start-up routine with change of state characterization.

FIG. 5 is a flow chart useful in describing an application start-up routine, which includes changing of the state characterization of the loader area from "new update/verify in progress" to "verified functional".

At 90, an application program (e.g., application image) start-up is initiated. The routine proceeds to determine the current state of loader area 0 at 91 and of loader area 1 at 92. The state of the newly downloaded area will be "new update/verify in progress", while the other area which was previously characterized as "verified functional" will fall within the "all other states" category. At 93, the state characterization of the newly downloaded area will be reset to "verified functional". No additional verification process is needed for this purpose. Since, at this point, the newly downloaded version of the loader image code has already successfully launched the application program in order for the FIG. 5 routine to have proceeded this far.

At 93, the existing count of prior retries to launch and run the loader image code, as discussed above, is also reset to zero. At 94, the application program proceeds to run for purposes of normal system operation.

As described, FIG. 3 provides an example of a fault tolerant memory update method using alternation of memory areas. By provision of alternating usage of the first and second memory areas 20 and 21 of FIG. 1 (represented by loader areas 0 and 1 in FIG. 3) a continuing indeterminate number of successive downloadings of code, which may represent a critical application loader program, are enabled to be implemented on a fault tolerant basis. Thus, critical code in one area of flash ROM, for example, can be erased to permit remote downloading of an update version of the code. With an operationally verified version of the code stored in a second area of flash ROM and undisturbed by the downloading, the system remains operable despite unsuccessful downloading. For successive downloadings over a period of time, the newest update version will be downloaded first into one memory area, with the next download into the other memory area, and the third download into the first memory area. Thus, with alternation of memory, the newest previously validated stored version of the code is always saved for use, on an if-required basis, if the downloading is not successfully accomplished.

While there have been described the currently preferred embodiments of the invention, those skilled in the art will recognize that other and further modifications may be made without departing from the invention and it is intended to claim all modifications and variations as fall within the scope of the invention.

What is claimed is:

1. A method to update a memory having first and second memory areas each with a stored version of a computer program, comprising:
   (a) identifying the one of said first and second memory areas currently storing the newer functional version of the computer program, as between said stored versions; and
   (b) storing a third version of the computer program in the one of said first and second memory areas not identified in step (a), to supersede a version stored therein.

2. A method as in claim 1, additionally comprising:
   (c) identifying the one of said first and second memory areas currently storing the newer functional version of the computer program, as between said newer functional version referred to in step (a) and said third version referred to in step (b);
   (d) storing a fourth version of the computer program in the one of said first and second memory areas not identified in step (c), to supersede a version then stored therein.

3. A method as in claim 1, wherein step (b) includes erasing the version of said computer program then stored in the one of said first and second memory areas not identified in step (a).

4. A method as in claim 1, wherein step (a) is initiated from a location remote from said memory and step (b) includes downloading said third version from said location.

5. A method as in claim 1, wherein each of said first and second memory areas is an area of flash memory which is erasable without erasing the other area.

6. A method as in claim 1, wherein step (b) comprises downloading an updated version of said computer program.

7. A method as in claim 1, wherein step (b) comprises storing said third version in the memory area not currently storing the newer functional version referred to in step (a).

8. A method as in claim 1, additionally comprising, before step (a), the initial steps of:
   (x) providing a memory having first and second areas of flash memory;
   (y) storing initial and later versions of said computer program, one version in each of said first and second memory areas.

9. A start-up method, for use with a memory having first and second memory areas with at least one said memory area containing a previously stored version of a computer program, comprising the steps of:
   (a) storing a subsequent version of the computer program in one of said first and second memory areas
   (b) identifying the one of said first and second memory areas currently storing the newer functional version of the computer program, as between said stored versions; and
   (c) using said newer functional version of the computer program.

10. A start-up method as in claim 9, wherein in step (a) said subsequent version of the computer program is stored by downloading.

11. A start-up method as in claim 9, wherein said first and second memory areas initially contain respective initial and first update versions of the computer program, and step (a) comprises storing a second update version of the computer code.

12. A start-up method as in claim 9, wherein step (a) comprises storing said subsequent version of the computer program in the one of said first and second memory areas currently storing one of: the oldest functional version of the computer code, as between two stored functional versions; and no version of the computer code.

13. A start-up method as in claim 9, wherein each of said first and second memory areas is an area of flash memory which is erasable without erasing the other area.

14. A memory update control system, comprising:
    a first memory area to store a version of a computer program;
    a second memory area to store a version of said computer program; and
    controller to control updating of said computer program, said controller arranged:
      (i) to initially identify the one of said first and second memory areas currently storing the newer functional version of the computer program, as between said stored versions; and
      (ii) to enable storage of a subsequent version of said computer program in the one of said first and second memory areas not initially identified as storing said newer functional version, to supersede the version stored therein.

15. A memory update control system as in claim 14, wherein the controller is further arranged:
    (iii) to subsequently identify the one of said first and second memory areas currently storing the newer functional version of the computer program, as between said newer functional version initially identified and said subsequent version; and
    (iv) to enable storage of a further version of the computer program in the one of said first and second memory areas not subsequently identified as storing the newer functional version, as between said newer functional version initially identified and said subsequent version.

16. A memory update control system as in claim 14, wherein the controller is further arranged to enable erasing of the version of said computer program stored in a memory area, to enable storage of a version of the computer program in said memory area.

17. A memory update control system as in claim 14, additionally comprising:
    a write-protected memory area to store code usable to load a computer program into a selected one of said first and second memory areas.

18. A memory update control system as in claim 14, wherein each of said first and second memory areas is an area of flash memory which is erasable without erasing the other area.

19. A memory facility comprising:
    a first memory area to store a version of a computer program;
    a second memory area to store a version of said computer program;
    said memory facility arranged, for purposes of computer program updating:
      to prevent entry of data into the one of said first and second memory areas currently storing the newer functional version of the computer program, as between said stored versions; and
      to permit storage of a third version of said computer program in the one of said first and second memory areas not currently storing said newer functional version of the computer program.

20. A memory facility as in claim 19, additionally comprising:
    a write-protected memory area to store code usable to load a computer program into a selected one of said first and second memory areas.

21. A memory facility as in claim 19, wherein each of said first and second memory areas comprises flash memory which is erasable without erasing the other area.

22. A controller for computer program loading, comprising:
- a memory interface to couple to first and second memory areas each storing a version of a computer program; and
- an executable program:
    (i) to initially identify the one of said first and second memory areas currently storing the newer version of the computer program, as between said stored versions; and
    (ii) to enable storage of a subsequent version of said computer program in the one of said first and second memory areas not initially identified as storing said newer functional version, to supersede the version stored therein.

23. A controller as in claim 22, wherein the executable program enables erasing of the version of said computer program stored in a memory area, to enable storage of a version of the computer program in said memory area.

24. A memory comprising:
- a first memory area storing a version of a computer program; and
- a second memory area storing a different version of said computer program;
- said memory areas independently accessible to enable storage of a subsequent version of said computer program in either the first or the second memory area without affecting the version stored in the other memory area.

25. A memory as in claim 24, wherein the computer program stored in one of said first and second memory areas can be erased, without erasing the computer program stored in the other memory area.

26. A memory as in claim 24, wherein each of said first and second memory areas comprises flash memory which is erasable without erasing the other area.

* * * * *